United States Patent
Miranda et al.

(10) Patent No.: US 6,782,486 B1
(45) Date of Patent: Aug. 24, 2004

(54) APPARATUS FOR STOPPING AND STARTING A CLOCK IN A CLOCK FORWARDED I/O SYSTEM DEPENDING ON THE PRESENCE OF VALID DATA IN A RECEIVE BUFFER

(75) Inventors: Paul C. Miranda, Austin, TX (US); Brian D. McMinn, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 555 days.

(21) Appl. No.: 09/637,178

(22) Filed: Aug. 11, 2000

(51) Int. Cl.[7] ............................................... G06F 1/10
(52) U.S. Cl. ...................................... 713/601; 713/322
(58) Field of Search ............................... 713/300, 320, 713/322, 324, 601

(56) References Cited

U.S. PATENT DOCUMENTS

| | | | |
|---|---|---|---|
| 5,155,825 A | | 10/1992 | Moughanni et al. |
| 5,452,434 A | * | 9/1995 | MacDonald ................. 713/601 |
| 5,812,875 A | * | 9/1998 | Eneboe ......................... 710/20 |
| 5,974,516 A | | 10/1999 | Qureshi |
| 6,075,833 A | * | 6/2000 | Leshay et al. ................ 377/16 |
| 6,157,688 A | | 12/2000 | Tamura et al. |
| 6,408,346 B1 | * | 6/2002 | Jirgal ........................... 710/25 |

FOREIGN PATENT DOCUMENTS

| | | | |
|---|---|---|---|
| EP | 0 285 335 | 3/1988 | |
| JP | 10050052 | 2/1998 | |
| JP | 2000267770 A | * 9/2000 | ............. G06F/1/32 |

OTHER PUBLICATIONS

"Gated Clock Removal Algorithm", IBM Technical Disclosure Bulletin, Oct. 1, 1996, US, pp. 157–160.*
International Search Report Application No. PCT/US 01/14908, mailed Jun. 27, 2002.

* cited by examiner

Primary Examiner—Thomas Lee
Assistant Examiner—Paul Yanchus, III
(74) Attorney, Agent, or Firm—Meyertons Hood Kivlin Kowert & Goetzel, P.C.; B. Noël Kivlin

(57) ABSTRACT

An efficient clock start and stop apparatus for clock forwarded system I/O. The apparatus may include a buffer coupled to receive incoming data from a data source. The buffer is clocked by a first clock signal that is provided by the data source. The buffer is configured to store the incoming data in a plurality of sequential lines in response to the first clock signal. The buffer may be further configured to store a plurality of bits in a plurality of occupied-bit registers. Each one of the plurality of occupied-bit registers indicates that data is present in a corresponding sequential line in the buffer. The apparatus may further include a clock gate circuit coupled to the buffer and configured to provide a second clock signal. The clock gate circuit may be further configured to start the second clock signal when valid data is present in the buffer and to stop the second clock signal when no data is present in the buffer.

21 Claims, 3 Drawing Sheets

APPARATUS FOR STOPPING AND STARTING A CLOCK IN A CLOCK FORWARDED I/O SYSTEM DEPENDING ON THE PRESENCE OF VALID DATA IN A RECEIVE BUFFER

BACKGROUND OF THE INVENTION

1. Field of the Invention

This invention relates to computer systems and, more particularly, to clock forwarded subsystems and power management.

2. Description of the Related Art

A computer system typically includes at least one processor (also referred to as a "microprocessor") that typically performs processing of a number of instructions from one or more programs or applications under execution. As part of its processing operations, the processor may need to access a number of system buses for required data transfer. For example, a multimedia application may require the processor to transfer certain data to a separate video processor and retrieve the processed information from the video processor through a dedicated video bus. Further, the processor may communicate with one or more I/O devices through a separate I/O bus, and with one or more system memories through a dedicated memory bus. Additional buses may be present in the computer system based on the system device complexity and the level of interconnection among various electronic devices constituting the computer system.

The computer system may also include a bus bridge to effectively manage the binary information traffic between the processor and one or more system buses. The bus bridge may also facilitate cache coherent data transfers within the system in view of the possibility of independent memory accesses by the processor and one or more I/O devices. Various system components may be coupled to the processor via the bus bridge. In other words, the bus bridge may be directly connected to the processor, and, hence, may directly receive all address and data information from the processor. The bus bridge may, in turn, distribute the received information to appropriate system devices via appropriate system buses. Similarly, information received from one or more system devices over different system buses may be routed to the processor via the bus bridge in a systematic manner.

To systematically exchange data between two devices, the devices may be connected via a clock forwarded interface for high bandwidth data transfers. A clock forwarded interface accomplishes point-to-point transfers of binary information by having the sender provide the receiver with a forward clock that latches the transmitted data at the receiver. The receiver may then sample the received binary information using its internal clock. The sender synchronizes the address and/or data transmitted by the sender to the forward clock.

A typical semiconductor device dissipates electrical power (i.e., transforms electrical energy into heat energy) during operation. The electrical power dissipated by a semiconductor device is proportional to the speed (or frequency) at which that semiconductor device operates during runtime. The higher the operating frequency of the semiconductor device, the greater the generation of heat energy by the semiconductor device. In applications where power requirements are critical, unnecessary power consumption may not be tolerable. Therefore, some devices may go into an idle state to reduce power consumption.

Additionally, the amount of noise that is generated by a semiconductor device is proportional to the amount of digital logic that is switching at any point in time. In order to reduce noise and power consumption in a clock forwarded I/O device, the transmitting clock may be turned off once the data has been latched at the receiver. The receiver of the device will continue to process the received data after the forward clock has stopped. In some cases, the receiver logic clock may continue to run even after there is no data to receive in order to maintain synchronicity when the sender begins transmitting data and a forward clock.

In a clock forwarded I/O device, it is desirable that the receiving device be allowed to enter a low power state when there is no data to process. It may therefore be desirable to allow the receiver to enter and exit its low power state while also ensuring the requisite synchronism between the forward clock from the sender and the internal receive logic clock of the receiver.

SUMMARY OF THE INVENTION

The problems outlined above may in large part be solved by an efficient clock stop and start apparatus for clock forwarded system I/O. In one embodiment, the apparatus may include a buffer coupled to receive incoming data from a data source. The buffer is clocked by a first clock signal that is provided by the data source. The buffer is configured to store the incoming data in a plurality of sequential lines in response to the first clock signal. The buffer may be further configured to store a plurality of bits in a plurality of occupied-bit registers. Each one of the plurality of occupied-bit registers indicates that data is present in a corresponding sequential line in the buffer.

The apparatus may further include a clock gate circuit coupled to the buffer and configured to provide a second clock signal. The clock gate circuit may be further configured to start the second clock signal when valid data is present in the buffer and to stop the second clock signal when no data is present in the buffer.

In other embodiments, the apparatus may include a plurality of synchronizers, which are coupled to the buffer. Each one of the plurality of synchronizers may be configured to latch the output of a corresponding one of the plurality of occupied-bit registers. Each one of the plurality of occupied-bit registers may be further configured to reset after the data present in a corresponding sequential line in the buffer has been accessed and in response to receiving a valid reset signal.

The apparatus described above may advantageously reduce power consumption and noise of a device by allowing a device that is receiving data in a clock forwarded I/O system to shut off its internal receiving logic clock when there is no data to process. Furthermore, the apparatus may also allow a device that is receiving data in a clock forwarded I/O system to start its internal receiving logic clock when data is received and is ready to be processed.

BRIEF DESCRIPTION OF THE DRAWINGS

Other objects and advantages of the invention will become apparent upon reading the following detailed description and upon reference to the accompanying drawings in which.

Figure 1:
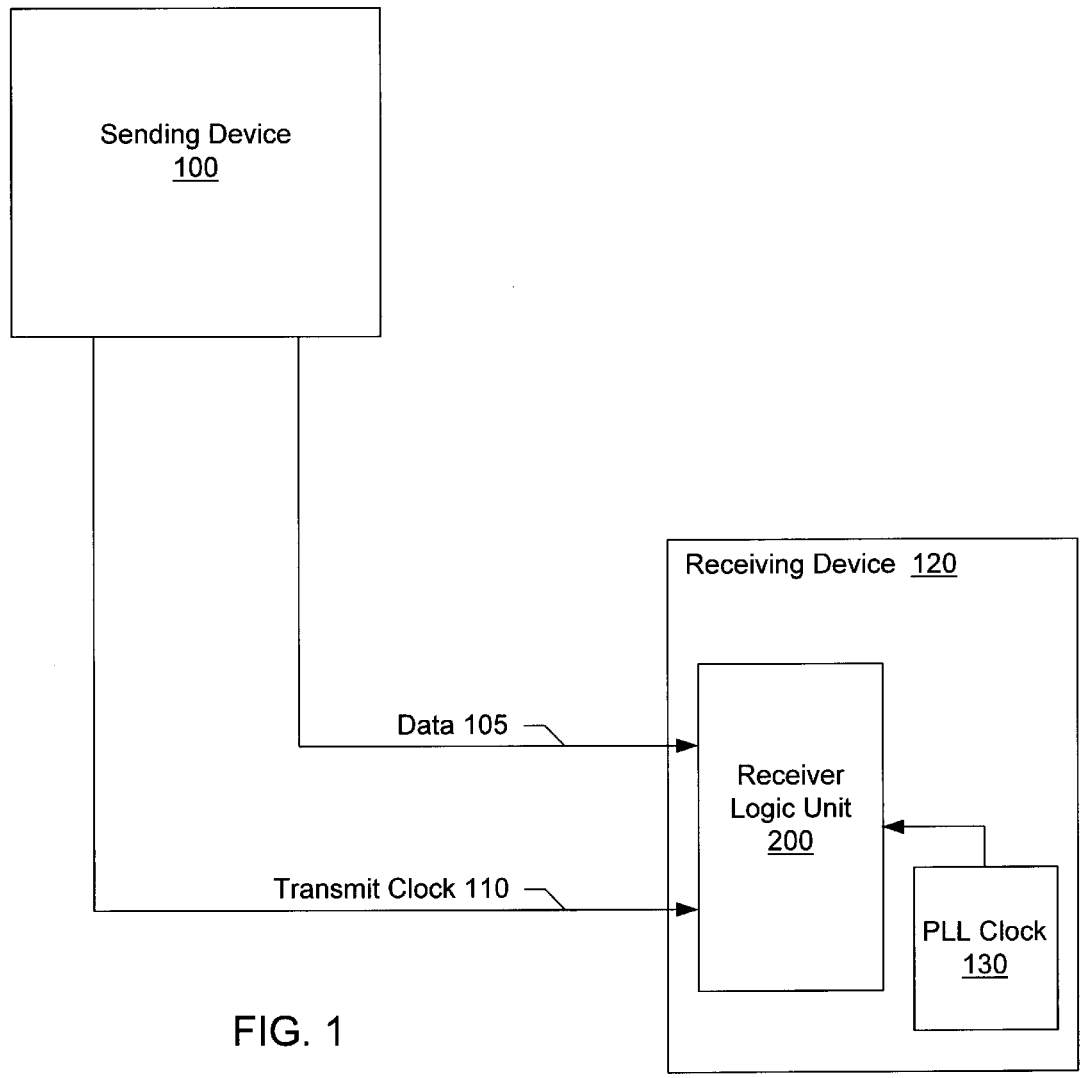
FIG. 1 is a block diagram of one embodiment of a send device and a receive device employing clock forwarding.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Referring now to FIG. 1, a block diagram of one embodiment of a send device and a receive device employing clock forwarding. A sending device 100 is coupled to a receiving device 120 by a pair of connections. Sending device 100, sends data 105 to receiving device 120 through one connection. Data 105 may include address information or data information or both. To keep the information of data 105 synchronized, sending device 100 also sends transmit clock 110 which is synchronized to data 105 via a second connection. Receiving device 120 includes a receiver logic unit 200 that latches the data using transmit clock 110. Receiving device 120 also includes a clock source such as a phased lock loop (PLL) clock 130, which provides the primary clock for receiving device 120. PLL clock 130 provides the clock signal for internal logic of receiver device 120 and receiver logic 200. Typically, PLL clock 130 runs continuously when power is applied to receiver device 120. As will be described in greater detail below, receiver logic 200 contains clock-gating circuitry which allows a clock to be stopped to portions of the logic, thereby lowering the power consumption and noise generation of receiving device 120. It is noted that while a pair of connections are discussed, there are likely to be many more connections between sending device 100 and receiving device 120. It is for ease of discussion and clarity that only the pair of connections is discussed.

Figure 2:
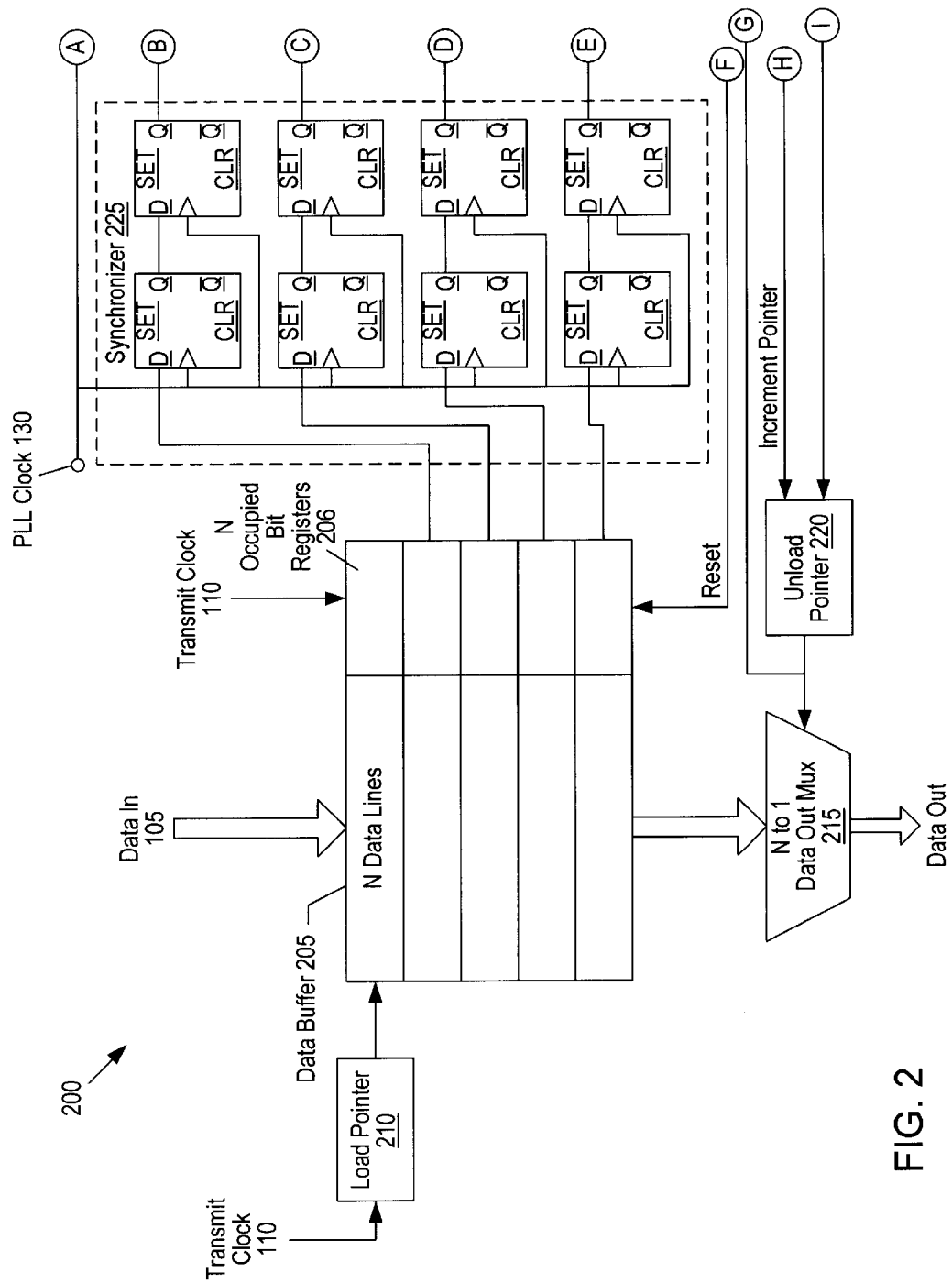
FIG. 2 is a block diagram of one embodiment of receiver logic including a clock start and stop apparatus.
Figure 2:
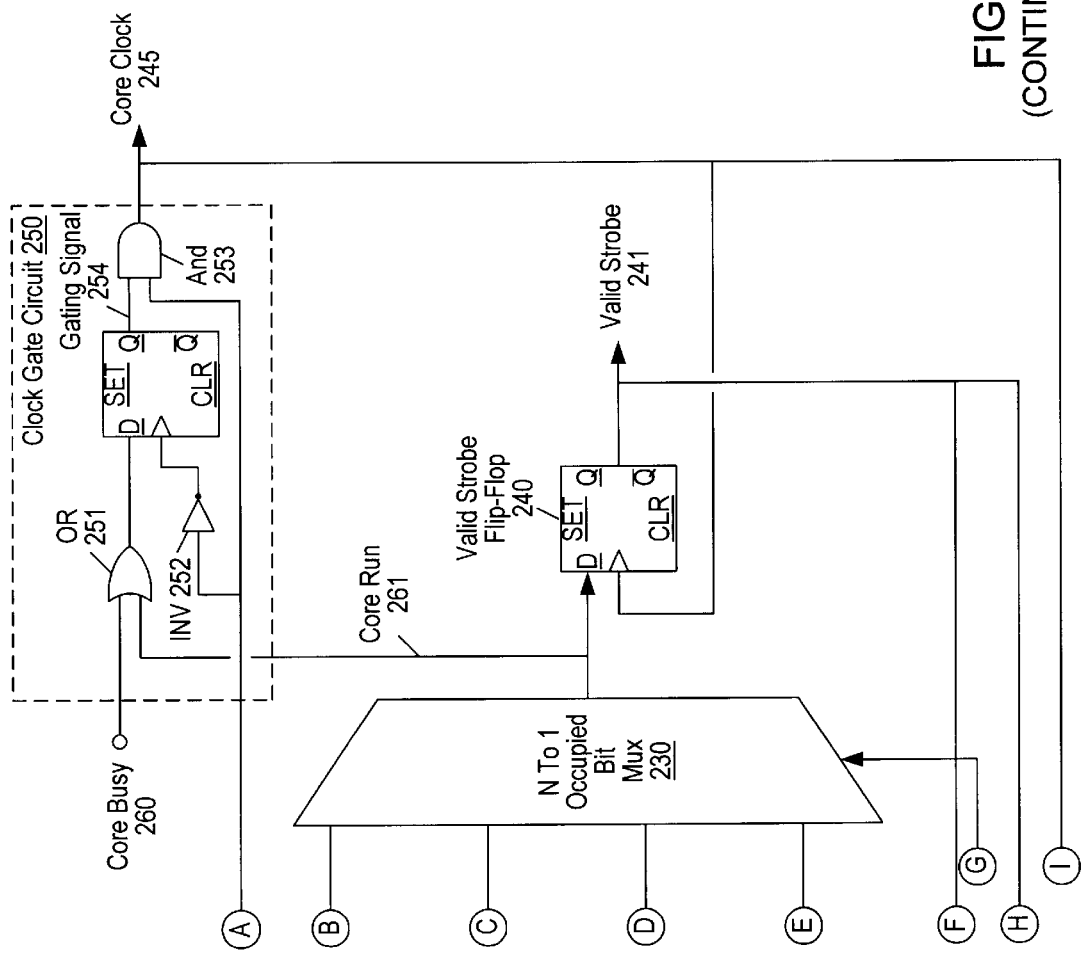

Turning now to FIG. 2, a block diagram of one embodiment of receiver logic including a clock start and stop apparatus. Circuit components that correspond to those shown in FIG. 1 are numbered identically for simplicity and clarity. Receiver logic unit 200 of FIG. 2 includes a data buffer 205 which is coupled to receive incoming data from data in 105 and a transmit clock 110. Data buffer 205 includes N occupied-bit registers 206. Receiver logic unit 200 also includes an unload pointer 220 coupled to an N to 1 data out multiplexer 215. A synchronizer 225 is coupled to data buffer 205. Synchronizer 225 is also coupled to an N to 1 occupied-bit multiplexer 230. A clock gate circuit 250 is coupled to N to 1 occupied-bit multiplexer 230 and to a valid strobe flip-flop 240.

A typical clock gate circuit includes logic which is configured to gate or stop the clock source to a block of logic by an enabling or disabling signal. Clock gate circuit 250 creates a new clock domain by providing core clock 245, which is used by the logic in receiver logic 200 as described below. PLL clock 130 is provided to one input of and-gate 253 while a gating signal 254 is provided to the other input to and-gate 253. The output of and-gate 253 is core clock 245. Gating signal 254 is developed using a negative edge, anti-glitch flip-flop 255. Anti-glitch flip-flop 255, latches the output of or-gate 251 on the falling edge of PLL clock 130 due to an inverter 252 inverting PLL clock 130. Latching the input to anti-glitch flip-flop 255 on the falling edge of PLL clock 130 ensures that the input data is stable, since all other logic is clocked on the rising edge, thus preventing glitches in the output of anti-glitch flip-flop 255. Clock gate circuit 250 is gated by either of two signals: a core busy 260 signal or a core run 261 signal. If either signal is at a logic one, then core clock 245 is in a run mode. Otherwise core clock 245 will be stopped. Core busy 260 signal may come from any source internal to receiver logic 200 which requires core clock 245 to be running and is not described further. Generation of core run 261 signal is described further below.

Data buffer 205 receives incoming data from another device or circuit, such as sending device 100 of FIG. 1, through data in 105 of FIG. 2. Data buffer 205 latches the received data on the rising edge of transmit clock 110. A load pointer 210 points to the next available location and steps sequentially through the locations in data buffer 205. Data buffer 205 consists of sequential memory locations where data may be stored in a first in first out configuration. Each memory location includes a corresponding occupied-bit register 206 which indicates, when set, that new data has been stored in a memory location. Once the data in a particular location has been accessed, the corresponding occupied-bit register 206 is reset indicating that location is now available for new data.

As data is stored to locations in data buffer 205 and occupied-bit registers 206 are set, synchronizer 225 latches the value in occupied-bit registers 206. Synchronizer 225 may consist of a pair of flip-flops for each occupied-bit register. By using a pair of flip-flops, it takes two clock cycles of PLL clock 130 to latch the value in occupied-bit registers 206. The output of each flip-flop pair in synchronizer 225 is one input to N to 1 occupied-bit multiplexer.

Unload pointer 220 is initialized at reset to the same location as the starting location of load pointer 210. Unload pointer is clocked by core clock 245, while load pointer 210 is clocked by transmit clock 110. This clocking scheme allows independent load and unload operations. Unload pointer 220 controls the select lines on data out multiplexer 215 and N to 1 occupied-bit multiplexer 230, thus pointing to both the data and its corresponding occupied-bit at the same time. Unload pointer 220 is incremented by a valid strobe 241 signal and an active core clock 245. A set occupied-bit being passed through N to 1 occupied-bit multiplexer 230 and latched by valid strobe flip-flop 240 produces valid strobe 241. Valid strobe 241 signal is also used to reset the occupied-bit register 206 in data buffer 205 corresponding to the data location that has been accessed. Each location in data buffer 205 that contains new data will have a corresponding occupied-bit register that is set. The output of N to 1 occupied-bit multiplexer 230 is core run 261 signal. An active core run 261 signal will allow core clock 245 to run. As long as there is new data in data buffer 205, core clock 245 will run. Core clock 245 may also continue to run if enabled by core busy 260 signal. Transmit clock 110 may stop once all data has been stored in data buffer 205. However, since data buffer 205 can independently store and access data, core clock 245 will continue to run and data will continue to be accessed until all data in data buffer 205 has been accessed.

Assuming that PLL clock 130 is running at a frequency at least as fast as transmit lock 110, the transmit clock domain logic can assume there is always room in data buffer 205. As described above, using a two flip-flop synchronizer means that it takes two clock cycles to latch the occupied-bit. Assuming also that the output switching time of data buffer 205 is much less than the period of core clock 245, then data can be accessed as soon as the occupied-bit is at the output of the second flip-flop of synchronizer 225. Therefore, to ensure that data buffer 205 does not overflow, it must contain enough memory locations to store the pieces of data that can arrive in the amount of time it takes to synchronize the occupied-bit and start core clock 245.

Numerous variations and modifications will become apparent to those skilled in the art once the above disclosure is fully appreciated. It is intended that the following claims be interpreted to embrace all such variations and modifications.

What is claimed is:

1. An apparatus for starting and stopping a clock in a clock forwarded I/O system, said apparatus comprising:

a buffer coupled to receive incoming data from a data source, wherein said buffer is clocked by a first clock signal which is provided by said data source, wherein said buffer is configured to store said incoming data in a plurality of sequential lines in response to said first clock signal;

wherein said buffer is configured to store a plurality of bits in a plurality of occupied-bit registers, wherein each one of said plurality of occupied-bit registers indicates that data is present in a corresponding sequential line in said buffer;

a clock gate circuit coupled to said buffer and configured to provide a second clock signal;

wherein said clock gate circuit is configured to start said second clock signal when valid data is present in said buffer and to stop said second clock signal when no data is present in said buffer.

2. The apparatus as recited in claim 1 further comprising a plurality of synchronizers, which are coupled to said buffer, wherein each one of said plurality of synchronizers is configured to latch the output of a corresponding one of said plurality of occupied-bit registers.

3. The apparatus as recited in claim 2 further comprising an occupied-bit multiplexer, which is coupled to said plurality of synchronizers and configured to provide an output of one of said plurality of synchronizers.

4. The apparatus as recited in claim 3, wherein said occupied-bit multiplexer is further configured to select an input indicated by said unload pointer.

5. The apparatus as recited in claim 3, wherein said output of one of said plurality of synchronizers indicates whether data in said corresponding sequential line in said buffer is valid.

6. The apparatus as recited in claim 1, wherein said buffer is further configured to unload data using an unload pointer which is clocked by said second clock signal.

7. The apparatus as recited in claim 6, wherein said buffer is further configured as a first in first out buffer.

8. The apparatus as recited in claim 1, wherein said each one of said plurality of occupied-bit registers is further configured to reset after said data present in a corresponding sequential line in said buffer has been accessed and in response to receiving a valid reset signal.

9. The apparatus as recited in claim 1, wherein said clock gate circuit is further configured to start said second clock signal if a core control signal is active.

10. The apparatus as recited in claim 2, wherein each one of said plurality of synchronizers comprises a pair of flip-flops.

11. An apparatus for starting and stopping a clock in a clock forwarded I/O system, said apparatus comprising:

a buffer coupled to receive incoming data from a data source, wherein said buffer is clocked by a first clock signal which is provided by said data source, wherein said buffer is configured to store said incoming data in a plurality of sequential lines in response to said first clock signal;

wherein said buffer is configured to store a plurality of bits in a plurality of occupied-bit registers, wherein each one of said plurality of occupied-bit registers indicates that data is present in a corresponding sequential line in said buffer;

a plurality of synchronizers, which are coupled to said buffer, wherein each one of said plurality of synchronizers is configured to latch the output of a corresponding one of said plurality of occupied-bit registers;

wherein said output of one of said plurality of synchronizers indicates whether data in said corresponding sequential line in said buffer is valid.

12. The apparatus as recited in claim 11 further comprising a clock gate circuit coupled to said buffer and configured to provide a second clock signal.

13. The apparatus as recited in claim 12, wherein said clock gate circuit is further configured to start said second clock signal when valid data is present in said buffer and to stop said second clock signal when no data is present in said buffer.

14. The apparatus as recited in claim 13, further comprising an occupied-bit multiplexer, which is coupled to said plurality of synchronizers and configured to provide an output of one of said plurality of synchronizers.

15. The apparatus as recited in claim 14, wherein said occupied-bit multiplexer is further configured to select an input indicated by said unload pointer.

16. The apparatus as recited in claim 15, wherein said output of one of said plurality of synchronizers indicates whether data in said corresponding sequential line in said buffer is valid.

17. The apparatus as recited in claim 11, wherein said buffer is further configured to unload data using an unload pointer which is clocked by said second clock signal.

18. The apparatus as recited in claim 11, wherein said buffer is further configured as a first in first out buffer.

19. The apparatus as recited in claim 11, wherein said each one of said plurality of occupied-bit registers is further configured to reset after said data present in a corresponding sequential line in said buffer has been accessed and in response to receiving a valid reset signal.

20. The apparatus as recited in claim 12, wherein said clock gate circuit is further configured to start said second clock signal if a core control signal is active.

21. The apparatus as recited in claim 11, each one of said plurality of synchronizers comprises a pair of flip-flops.

* * * * *